United States Patent
Kettner et al.

(10) Patent No.: US 10,891,775 B2
(45) Date of Patent: Jan. 12, 2021

(54) AUTOMATIC LEVEL-OF-DETAIL FOR PHYSICALLY-BASED MATERIALS

(71) Applicant: NVIDIA Corporation, Santa Clara, CA (US)

(72) Inventors: Lutz Kettner, Berlin (DE); Jan Jordan, Berlin (DE)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 16/662,539

(22) Filed: Oct. 24, 2019

(65) Prior Publication Data

US 2020/0058154 A1 Feb. 20, 2020

Related U.S. Application Data (63) Continuation of application No. 15/599,320, filed on May 18, 2017, now Pat. No. 10,504,273.

(60) Provisional application No. 62/432,475, filed on Dec. 9, 2016.

(51) Int. Cl.

| | | |
|---|---|---|
| G06T 15/04 | (2011.01) | |
| G06T 15/00 | (2011.01) | |
| G06F 16/901 | (2019.01) | |
| G06T 15/50 | (2011.01) | |
| G06F 30/20 | (2020.01) | |

(52) U.S. Cl.
CPC .......... *G06T 15/04* (2013.01); *G06F 16/9024* (2019.01); *G06F 30/20* (2020.01); *G06T 15/005* (2013.01); *G06T 15/506* (2013.01)

(58) Field of Classification Search
CPC ..... G06T 15/04; G06T 15/005; G06T 15/506; G06F 17/30958; G06F 17/5009; G06F 16/9024; G06F 30/20
See application file for complete search history.

(56) References Cited

U.S. PATENT DOCUMENTS

| | | |
|---|---|---|
| 6,765,573 B2 | 7/2004 | Kouadio |
| 7,312,797 B2 | 12/2007 | Tong et al. |
| 7,548,238 B2 | 6/2009 | Berteig et al. |
| 7,898,520 B2 | 3/2011 | Freier |
| 8,269,772 B1 * | 9/2012 | Smits ............... G06T 13/80 345/426 |
| 8,730,240 B2 | 5/2014 | Wang et al. |

(Continued)

FOREIGN PATENT DOCUMENTS

DE 102006059829 A1 6/2008

OTHER PUBLICATIONS

Zirr et al., "Real-time rendering of procedural multiscale materials," Proceedings of the 20th ACM SIGGRAPH Symposium on Interactive 3D Graphics and Games, ACM, 2016, pp. 1-10.

(Continued)

*Primary Examiner* — Xin Sheng
(74) *Attorney, Agent, or Firm* — Zilka-Kotab, P.C.

(57) ABSTRACT

A method, computer readable medium, and system are disclosed for implementing automatic level-of-detail for physically-based materials. The method includes the steps of identifying a declarative representation of a material to be rendered, creating a reduced complexity declarative representation of the material by applying one or more term rewriting rules to the declarative representation of the material, and returning the reduced complexity declarative representation of the material.

20 Claims, 4 Drawing Sheets

(56) References Cited

U.S. PATENT DOCUMENTS

| | | | |
|---|---|---|---|
| 8,773,433 | B1 | 7/2014 | Smyrl |
| 8,780,108 | B2 | 7/2014 | Ellens et al. |
| 8,872,825 | B2 | 10/2014 | Baril et al. |
| 9,019,298 | B2 | 4/2015 | Xie et al. |
| 9,235,927 | B2 | 1/2016 | Mitev et al. |
| 2003/0088533 | A1 | 5/2003 | Fortenberry et al. |
| 2004/0263510 | A1 | 12/2004 | Marschner et al. |
| 2010/0107132 | A1 | 4/2010 | Bjesse |
| 2010/0199257 | A1 | 8/2010 | Biggerstaff |
| 2014/0267340 | A1 | 9/2014 | Kettner et al. |
| 2015/0213641 | A1 | 7/2015 | Suessenbach et al. |
| 2015/0356073 | A1 | 12/2015 | Vion-Drury |
| 2015/0379162 | A1 | 12/2015 | MohammadBagher et al. |
| 2018/0165868 | A1 | 6/2018 | Kettner et al. |

OTHER PUBLICATIONS

Velázquez-Armendáriz et al., "Automatic bounding of programmable shaders for efficient global illumination," ACM Transactions on Graphics (TOG), vol. 28, No. 5, ACM, 2009, pp.

Kettner et al., U.S. Appl. No. 62/432,475, filed Dec. 9, 2016.

Ashikhmin et al., "An anisotropic phong BRDF model," Journal of graphics tools, vol. 5, No. 2, Aug. 13, 2000, pp. 25-32.

Aittala et al., "Two-shot SVBRDF capture for stationary materials," ACM Trans. Graph., vol. 34, No. 4, 2015, pp. 110:1-110:13.

Heitz et al., "Importance sampling microfacetbased BSDFs using the distribution of visible normals," Comput. Graph. Forum, vol. 33, No. 4, 2014, pp. 1-10.

He et al., "A system for rapid exploration of shader optimization choices," ACM Trans. Graph., vol. 35, No. 4, Jul. 2016, pp. 1-12.

He et al., "A system for rapid, automatic shader level-of-detail," ACM Trans. Graph., vol. 34, No. 6, Oct. 2015, pp. 1-12.

NVIDIA Corporation, "NVIDIA Material Definition Language 1.1, Technical Introduction," May 12, 2014, pp. 1-24.

Olano et al., "Automatic shader level of detail," Proceedings of the ACM SIGGRAPH/EUROGRAPHICS conference on Graphics hardware, Eurographics Association, 2003, pp. 1-9.

Oren et al.,"Generalization of the Lambertian model and implications for machine vision," International Journal of computer Vision, vol. 14, No. 3, 1995, 227-251.

Pellacini, F., "User-configurable automatic shader simplification," ACM Transactions on Graphics (TOG), vol. 24, No. 3, ACM, 2005, pp. 1-8.

Sitthi-Amorn et al., "Genetic programming for shader simplification," In Proceedings of the 2011 SIGGRAPH Asia conference, ACM, 2011, pp. 1-11.

Schwartz et al., "Level-of-Detail Streaming and Rendering using Bidirectional Sparse Virtual Texture Functions," Computer Graphics Forum, 2013, vol. 32, No. 7, pp. 1-10.

Wu et al.,"A sparse parametric mixture model for BTF compression, editing and rendering," Computer Graphics Forum, 2011, vol. 30, No. 2, pp. 1-9.

Walter et al., "Microfacet models for refraction through rough surfaces," In Proceedings of the 18th Eurographics Conference on Rendering Techniques, EGSR'07, 2007, pp. 1-12.

Wang et al., "Automatic shader simplification using surface signal approximation," ACM Transactions on Graphics (TOG), vol. 33, No. 6, 2014, pp. 1-11.

Jakob et al., "A Comprehensive Framework for Rendering Layered Materials," ACM SIGGRAPH, 2014, pp. 1-14.

Catalano et al., "GI Next: Global illumination for production rendering on GPUs," ACM SIGGRAPH 2016 Talks, 2016, pp. 1-2.

Kettner et al., U.S. Appl. No. 15/599,320, filed May 18, 2017.

Non-Final Office Action from U.S. Appl. No. 151599,320, dated Sep. 28, 2019.

Final Office Action from U.S. Appl. No. 15/599,320, dated Mar. 28, 2019.

Notice of Allowance from U.S. Appl. No. 15/599,320, dated Jul. 24, 2019.

Office Action from German Patent Application No. 10 2017 127 367.0, dated May 20, 2020.

\* cited by examiner

AUTOMATIC LEVEL-OF-DETAIL FOR PHYSICALLY-BASED MATERIALS

CLAIM OF PRIORITY

This application is a continuation of U.S. application Ser. No. 15/599,320, titled "Automatic Level-of-Detail for Physically-Based Materials," filed May 18, 2017, which claims the benefit of U.S. Provisional Application No. 62/432,475 titled "Automatic Level-of Detail for Physically-Based Materials," filed Dec. 9, 2016, the entire contents of which are incorporated herein by reference.

FIELD OF THE INVENTION

The present invention relates to physical-based rendering, and more particularly to reducing material complexity in a physical-based rendering context.

BACKGROUND

Level-of-detail is used in rendering to reduce the complexity of a rendering task while preserving some form of fidelity of the rendered result. The rendering complexity is at least partially determined by geometry, material, and lighting complexity. With physical-based rendering, material complexity may be separated into texturing functions and bidirectional scattering distribution functions (BSDFs).

Complex materials may be constructed using a declarative paradigm by defining an expression that combines simple distribution function (e.g., BRDF, BTDF, EDF, phase function) terms. However there is not currently a system to automatically derive a simpler declarative material representation to reduce material complexity and implement levels of detail.

Thus, there is a need for addressing these issues and/or other issues associated with the prior art.

SUMMARY

A method, computer readable medium, and system are disclosed for implementing automatic level-of-detail for physically-based materials. The method includes the steps of identifying a declarative representation of a material to be rendered, creating a reduced complexity declarative representation of the material by applying one or more term rewriting rules to the declarative representation of the material, and returning the reduced complexity declarative representation of the material.

DETAILED DESCRIPTION

Figure 1:
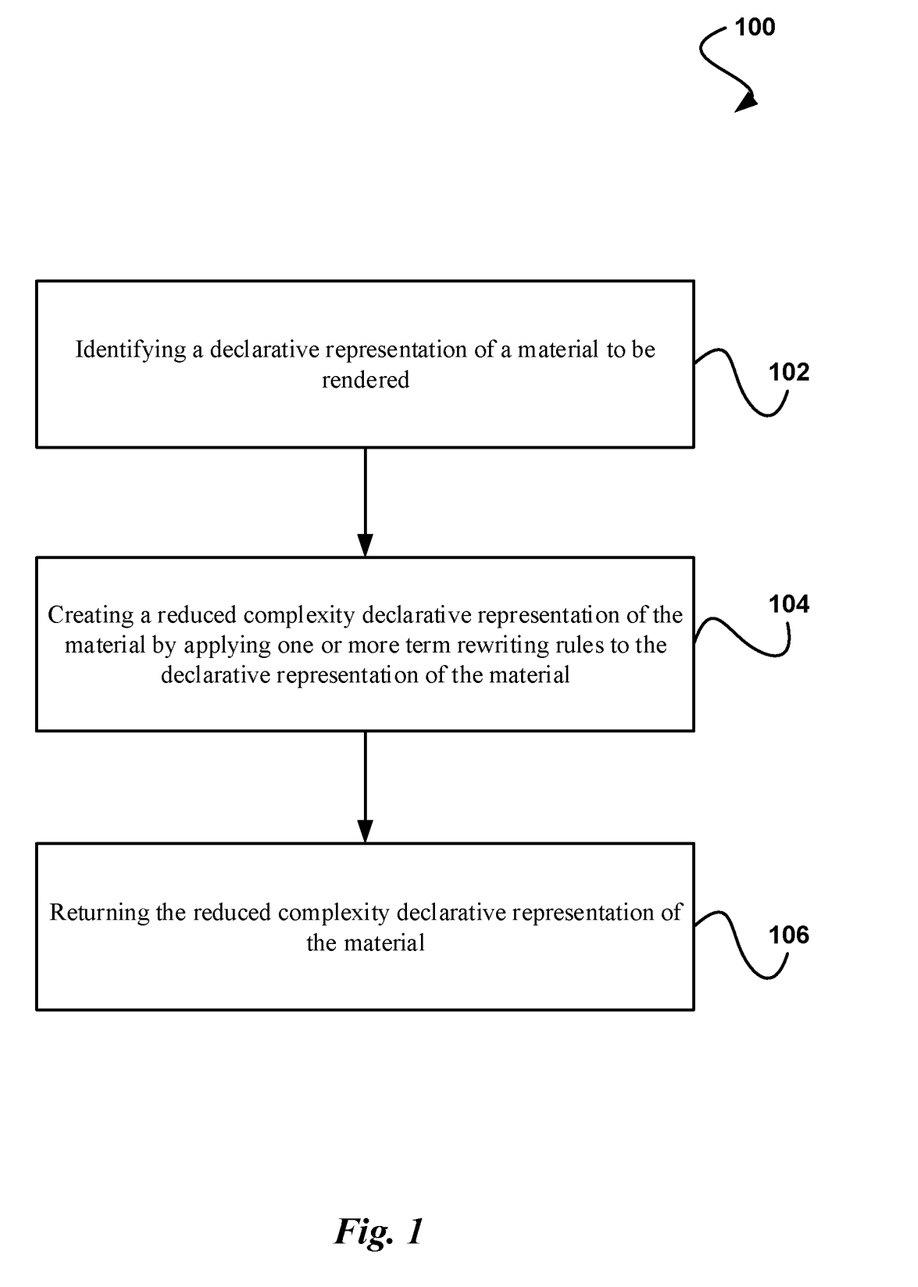
FIG. 1 illustrates a flowchart of a method for implementing automatic level-of-detail for physically-based materials, in accordance with one embodiment.

FIG. 1 illustrates a flowchart of a method 100 for implementing automatic level-of-detail for physically-based materials, in accordance with one embodiment. As shown in operation 102, a declarative representation of a material to be rendered is identified. In one embodiment, the declarative representation may include a semantically specified representation of the material in a declarative programming paradigm. For example, the declarative programming paradigm may express the logic of one or more computations without describing control flow. See, for example, U.S. Patent Pub. 2014/0267340 (Kettner et al.), which is hereby incorporated by reference in its entirety.

Additionally, in one embodiment, the declarative representation may include an expression tree or directed acyclic graph (DAG). In another embodiment, the expression tree may include a tree used to represent one or more expressions. For example, one or more nodes of the expression tree may each represent a function call. In another example, the function call may call a regular function, where regular functions may compute a result based on a black box implementation. In another example, the function call may call a distribution function, where the distribution functions include one or more of a bidirectional reflectance distribution function (BRDF) or a bidirectional scattering distribution function (BSDF). In another embodiment, the declarative representation may include an expression tree, where one or more nodes of the expression tree each represent a function call or a distribution function including one or more of a bidirectional reflection distribution function (BRDF), a bidirectional transmission distribution function (BTDF), an emission distribution function (EDF), and a phase function.

Further, in one embodiment, both regular functions and distribution functions may be included within the expression tree. For example, all nodes above a graph-cut in the expression tree may form a declarative part of the tree with fully defined semantics. In another example, all nodes below the graph-cut may form a set of trees that each provide a value for a parameter of the declarative part of the tree. In yet another example, a distribution function may have another distribution function and/or a regular function as an argument.

Further still, in one embodiment, the root of the expression tree may include a function that takes a BSDF and a mapping vector as arguments. In another embodiment, the declarative representation of the material may include a material expression or a material definition that includes a defining expression, where the defining expression may be reduced by one or more rules, and where a parameter value of the defining expression conditionally prevents a matching of one or more rules. In yet another embodiment, the material may be rendered utilizing a physical based rendering (PBR) model.

Also, in one embodiment, the leaves of the tree may represent one or more values. In another embodiment, each edge of the tree may represent a use of a value or function return value as an argument in a function of a respective parent node.

In addition, as shown in operation 104, a reduced complexity declarative representation of the material is created by applying one or more term rewriting rules to the declarative representation of the material. In one embodiment, the reduced complexity declarative representation of the material may include a material expression having a reduced complexity when compared to the material expression to which the one or more rewriting rules were applied. For example, the reduced complexity declarative representation of the material may include an expression tree or directed acyclic graph (DAG) having a reduced complexity.

Further still, in one embodiment, the term rewriting rules may change (e.g., rewrite, etc.) a term within the declarative representation of the material. For example, term rewriting may include replacing individual subterms of an expression with other terms. It may allow rewriting an expression to meet a certain goal or set of restrictions. In another embodiment, the term rewriting rules may map the material to another material. For example, pattern matching may be used to match an expression (representing a structural part in the material) and replace the expression with another expression. In another example, during pattern matching, an expression may match another expression if the expression is part of the other expression.

Also, in one embodiment, a plurality of term rewriting rules may be applied to the declarative representation of the material to create the reduced complexity declarative representation of the material. In another embodiment, an order in which the plurality of term rewriting rules are applied may be determined. For example, the plurality of term rewriting rules may be applied in sequence. In another example, the plurality of term rewriting rules may be applied recursively.

Additionally, in one example, the expression tree may be traversed in a predetermined order, and a plurality of term rewriting rules may be matched to nodes and applied during the traversal. In another example, a plurality of term rewriting rules may be applied in all possible orders to create a plurality of reduced complexity declarative representations of the material, and one of the plurality of representations may be selected according to one or more predetermined criteria. In yet another example, the plurality of term rewriting rules may be applied in a subset of all possible orders, using a predetermined selection strategy, to create a plurality of reduced complexity declarative representations of the material, and one of the plurality of reduced complexity declarative representations of the material may be selected according to one or more predetermined criteria, where the predetermined selection strategy is based on greedy selection, an arbitrary cost function, or selection criteria on which rules to apply and which ones to not apply.

In another embodiment, the declarative representation may be traversed recursively in a depth first, left to right order, and the one or more term rewriting rules may be matched against and applied on a current node of the declarative representation during traversal, where sub-expressions of the declarative representation may be traversed recursively after applying the one or more term rewriting rules. In yet another embodiment, the declarative representation may be traversed recursively in a depth first, left to right order, and the one or more term rewriting rules may be matched against and applied on a current node of the declarative representation only after all sub-expressions of the current node have been traversed recursively.

In another embodiment, the one or more term rewriting rules may be determined by defining a plurality of terminating expressions, creating a plurality of matching patterns for all BSDFs within the declarative representation, where the plurality of matching patterns enumerate all possible combinations of how the plurality of terminating expressions can show in parameters of the BSDFs, eliminating from the plurality of matching patterns those that are equal to the plurality of terminating expressions to create a plurality of remaining patterns, and for each of the plurality of remaining patterns, choosing a replacement expression from the plurality of terminating expressions and defining arguments of the replacement expression based on arguments of a match within the remaining pattern.

Further, in one embodiment, the term rewriting rules may be applied to a material expression, and may create a sequence of material expressions that terminate with a final reduced complexity material expression. For example, the term rewriting rules may be designed to obtain a predetermined property or invariant for the final reduced complexity material expression. In another example, the term rewriting rules may be designed to obtain a predetermined property or invariant for each of the sequence of material expressions as well as the final reduced complexity material expression. For instance, each subsequent material expression in the sequence may be a simplification of a preceding material expression in the sequence, etc. In this way, the final reduced complexity material expression, as well as the sequence of material expressions, may be created with a predetermined level of detail utilizing a single process.

Further still, in one embodiment, the term rewriting rules may be determined utilizing an inductive process. In another embodiment, the expression tree may be extended to an acyclic graph representation. In yet another embodiment, the declarative representation of the material may include one or more unspecified parameters. For example, a user of the material may provide values for the unspecified parameters. In another example, the declarative representation of the material may be implemented utilizing a class structure, where the unspecified parameters are included in an instance of the class.

Also, in one embodiment, arguments in the expression tree may be evaluated and used in the one or more term rewriting rules. In another embodiment, annotations or other metadata may be included within the declarative representation, where the annotations or other metadata may be used to select one or more term rewriting rules or may be used as additional parameters during the applying of the one or more term rewriting rules to the declarative representation of the material. In yet another embodiment, one or more term rewriting rules may be applied to generic functions. In still another embodiment, pattern matching used to match expressions may match multiple patterns simultaneously, and variables may then be bound using a unification algorithm.

In addition, in one embodiment, one or more term rewriting rules may replace a bump map of the material with a roughness map of the material. In another embodiment, one or more term rewriting rules may approximate flakes utilizing a glossy BSDF. In yet another embodiment, one or more term rewriting rules may statically replace a complex high-detail material with a simpler low-detail far field material. In still another embodiment, the expression tree may incorporate texture baking.

Furthermore, as shown in operation 106, the reduced complexity declarative representation of the material is returned. In one embodiment, the reduced complexity declarative representation of the material may be rendered to create a visual result. In another embodiment, the rendering may be performed utilizing a physically based rendering (PBR) model. In yet another embodiment, the identification of the declarative representation of the material to be rendered, as well as the creation and returning of the reduced complexity declarative representation of the material, may be performed by one or more hardware processors (e.g., a graphics processing unit (GPU), a central processing unit (CPU), etc.), dedicated hardware, etc.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Level-of-Detail Framework

In one embodiment, a level-of-detail framework may apply ideas of term rewriting systems to the specific declarative expressions used to build BSDFs and materials in a declarative language (e.g., the NVIDIA Material Definition Language (MDL), etc.). One application of this idea may transform more complex BSDF expressions into simpler BSDF expressions while moving the desired effect of the complex BSDF expression into the textures that feed into the parameters of the simpler BSDF expression. In the following, we introduce the framework and how it may be systematically used.

Framework

In this section, we define in more detail declarative expressions and how rules of a term-rewriting system may operate on them. We define a representative subset of the declarative expression language of MDL and explain how term-rewriting rules may operate on these expressions to create a sequence of materials of less-and-less detail, which ends, for example, in a single diffuse BRDF. We further explore variants and extensions of the basic idea.

Declarative Expressions to Define Physically-Based Materials

For the sake of clarity of the initial exposition of our ideas, we start with a simplified material model ignoring transparency, emission, and volumetric effects. They may be handled analogously. We model a physically-based material as an expression tree, which can be extended to a directed-acyclic graph as described later. The tree may consist of function calls as nodes in the tree and values in the leaves of the tree. An edge in the tree may denote the use of a value or a function return value as an argument in the function of its respective parent node.

One exemplary distinction between the declarative material definition and the procedural language to define texturing materializes in this expression tree as two kind of nodes: regular functions and distribution functions.

Regular functions may compute a result from their arguments based on an unknown (black box) implementation. These functions may thus be implemented, for example, with a procedural language without impacting the benefits of the declarative part. However, the functions may be assumed to be pure, i.e., side-effect free. Additionally, they may access render state, such as position, normal, UV texture spaces, etc., which may be treated as an always present implicit parameter.

Dealing only with the surface scattering behavior of a material in the beginning, the distribution functions are BRDFs (which may be extended to BSDFs). In contrast to the regular functions, their behavior (although not their implementations) may be fully specified and known with their semantic.

Regular functions may not have distribution functions as arguments. Distribution functions may have other distribution functions and regular functions as arguments. We furthermore use a dedicated function M as the root of the expression tree with one BSDF and further arguments. It may be part of the declarative definition.

The distinction between the declarative part and the regular functions may create a graph-cut in this expression tree. All nodes above the cut may form a tree with fully defined semantics. All remaining nodes below the cut may form a forest, a set of trees with each tree providing a value for a parameter of the declarative part.

This may allow us to analyze the meaning of a composition of distribution functions in the upper tree and transform them to a different one while understanding the impact of that transformation. We may do this in distinction to other simplification methods on this high-level tree representation. In our notations, we will use upper case letters to denote distribution functions, and lower case letters for regular functions and values.

Table 1 illustrates the dedicated function M that is the root of an expression tree, as well as associated arguments, in accordance with one embodiment. Of course, it should be noted that the root and associated arguments shown in Table 1 is set forth for illustrative purposes only, and thus should not be construed as limiting in any manner.

TABLE 1

| $\mathcal{M}$ (B, n) | |
|---|---|
| Arg | Definition |
| B | Bidirectional Scattering Distribution Function (BSDF) |
| n | normal mapping vector, default is the normal $n_s$ in the render state |

Table 2 illustrates distribution functions (BSDFs) for use in top levels of the expression tree, in accordance with one embodiment. Of course, it should be noted that the BSDFs shown in Table 2 are set forth for illustrative purposes only, and thus should not be construed as limiting in any manner.

TABLE 2

| BSDF | Definition |
|---|---|
| elemental | |
| 0 | Null BSDF, which renders black. |
| D(c, r) | Lambertian reflection extended by the Oren-Nayar microfacet model [ON95] with a color tint c and roughness r. |
| S(c) | Specular reflection with a color tint c. |
| G(c, $r_u$, $r_v$, t) | Glossy reflection based on a microfacet model [WMLT07] using a Phong distribution [AS00] and a v-cavities shadowing term [Hd14] with a color tint c and anisotropic roughnesses in u-direction along the tangent t, $r_u$, and v-direction, $r_v$. The Phong distribution exponent e is computed as e = $2/r^2$. |
| modifier | |
| T(c, B) | Tint a base BSDF B with the color c. |
| mixer | |
| W($w_0$, $A_0$, ...) | Weighted sum of BSDFs, $w_i \geq 0$ and $\Sigma w_i \leq 1$ |
| layerer | |
| L(w, A, B, n) | Weighted layering, wA + (1 − w)B, and a normal map n applied to top layer A. |
| F(i, w, A, B, n) | Fresnel layering, w'A + (1 − w')B where w' = w * fresnel(i) is a weighted, IOR-dependent Fresnel term, and a normal map n applied to top layer A. |

Table 3 illustrates arguments used within the distribution functions, in accordance with one embodiment. Of course, it should be noted that the arguments shown in Table 3 are set forth for illustrative purposes only, and thus should not be construed as limiting in any manner.

TABLE 3

| Arg | Definition |
|---|---|
| c | a color value for tint |
| r | roughness in the Oren-Nayar reflectance model |
| $r_u$ | roughness in the microfacet model in u-direction |
| $r_v$ | roughness in the microfacet model in v-direction |
| t | tangent vector to define the u-direction for anisotropy |
| i | index of refraction (IOR) |
| $w, w_0, \ldots$ | scalar weights in [0, 1] |
| A, B | BSDFs |
| n | normal vector for local normal perturbation |

Table 4 illustrates an example MDL material that defines a simple plaster material based on a 0.7 gray color for the tint of a diffuse BRDF, in accordance with one embodiment. Of course, it should be noted that the MDL material shown in Table 4 is set forth for illustrative purposes only, and thus should not be construed as limiting in any manner.

TABLE 4

```
material plaster ( ) = material (
    surface: material_surface (
        scattering: df::diffuse_reflection_bsdf (
            tint: color(0.7)
        )
    )
);
```

Table 5 illustrates an exemplary function expression M that concisely expresses the MDL material in Table 4 using the notations from Table 1-3, in accordance with one embodiment. Of course, it should be noted that the function expression shown in Table 5 is set forth for illustrative purposes only, and thus should not be construed as limiting in any manner.

TABLE 5

$\mathcal{M}(D(0.7, 0.0), n_s)$

In one embodiment, transmission and more exotic BSDFs, such as retro-refractive or measured BSDFs, may be added following the same principles as for the other BSDFs.

Rules Operating on Expressions

Given an expression, we may define rules to rewrite a term in this expression and replace it with another term. In its most general form, a rule may include a map that maps one material M to some other material M'. More specifically, we may use pattern matching to match a certain structural part in a material and replace that part by another expression. Such a rule may only be applicable on a material if that material has a sub-expression matching this pattern.

Patterns may include expressions with distribution functions and they may match an expression if its own expression is part of the matched expression. To be more universally useful, patterns may also use variables, which match arbitrary sub-expressions and may later be used in the replacement expression. For example, D(c, r) may define a pattern matching the diffuse BSDF defined above with the variables c for the tint color and r for the roughness parameters of this BSDF.

The pattern F(i, w, S(c), B, n) may match all specular BSDFs that are Fresnel layered over an arbitrary base BSDF B. The variables in the pattern may be used in the replacement expression. In addition, we may allow standard algebraic operations and functions in the replacement expression.

Table 6 illustrates an exemplary rule with the pattern on the left and the replacement expression on the right, in accordance with one embodiment. Of course, it should be noted that the exemplary rule shown in Table 6 is set forth for illustrative purposes only, and thus should not be construed as limiting in any manner.

TABLE 6

$W(w_1, D(c_1, r_1), w_2, D(c_2, r_2)) \mapsto D(w_1 c_1 + w_2 c_2, w_1 r_1 + w_2 r_2)$ As shown in Table 6, the rule may implement a transformation that replaces a weighted mix of two diffuse BRDFs by a single diffuse BRDF whose parameters are weighted sums of the respective input parameters. This rule may be intuitively right for the color parameter but approximate for the roughness parameter. Additional rules and approximations may be subject to the individual rule sets in specific application scenarios.

Pattern matching may be more powerful and may restrict certain parameters to be of a certain value including dependencies on other variables. Table 7 illustrates a restriction of the rule in Table 6 to only match diffuse BRDFs of equal roughness r, in accordance with one embodiment. Of course, it should be noted that the exemplary restriction shown in Table 7 is set forth for illustrative purposes only, and thus should not be construed as limiting in any manner.

TABLE 7

$W(w_1, D(c_1, r), w_2, D(c_2, r)) \mapsto D(w_1 c_1 + w_2 c_2, r)$

We may use additional variables in the target expression for a concise notation where needed and define their values later. Table 8 illustrates an alternate notation for the rule restriction in Table 7, in accordance with one embodiment. Of course, it should be noted that the alternate notation shown in Table 8 is set forth for illustrative purposes only, and thus should not be construed as limiting in any manner.

TABLE 8

$W(w_1, D(c_1, r), w_2, D(c_2, r)) \mapsto D(c', r)$, where $c' = w_1 c_1 + w_2 c_2$ In general, one may extend this scheme to multiple patterns. One important case may include the possible cross interaction of parts of the material model, such as normal maps, with parts of the BSDFs, like the local normal maps of the layering BSDFs. Since the material model function (M) may always be the root of the expression tree, we may simplify the notation of matching (M) and may allow rules to make direct use of all arguments of (M), which is n in this case, including assigning new expressions to them.

For example, we may move the local normal map of a weighted layering to the global normal map respecting the weight of the layer. Note that $n_s$ is the surface normal in the render state and the default for the normal map. We may give this rule an additional precondition that it only applies if $n_1 \neq n_s$, which may be an optimization avoiding idempotent transformations in this case.

Table 9 illustrates this normal map movement and precondition, in accordance with one embodiment. Of course, it should be noted that the normal map movement shown in Table 9 is set forth for illustrative purposes only, and thus should not be construed as limiting in any manner.

TABLE 9

$L(w, A, B, n_1) \mapsto L(w, A, B, n_s), n \mapsto f_n(1, n, w, n_1),$ if $n_1 \ne n_s$ In one embodiment, as shown in Table 9, $f_n(w_1; n_1, \ldots)$ may include a function that scales normal maps according to weights and blends them together. Table 10 illustrates a case with two normals, in accordance with one embodiment. Of course, it should be noted that the case with two normals shown in Table 10 is set forth for illustrative purposes only, and thus should not be construed as limiting in any manner.

TABLE 10

$f_n(w_1, n_1, w_2, n_2) = \text{normalize}(n_s + w_1(n_1 - n_s) + w_2(n_2 - n_s))$ Term-Rewriting System as a Level-of-Detail Scheme Given a set R of term-rewriting rules, there may be a question as to which order matching rules will be applied in the case where multiple rules are applicable at the same time. This question is important in two contexts: correctness and efficiency. For correctness properties, such as a termination proof or that a rule system always results in a specific standard material model, a proof independent of the rule application order may be possible. Such a rule system is called confluent. This may then be used to implement efficient evaluation orders without affecting correctness. More complex rule systems and their desired properties may need more controlled ordering. A few possibilities are listed below.

Multiple Rule Sets

A system may use multiple rule sets in sequence. Rule sets applied first may establish invariants that later rule sets can rely on, such as the elimination of a specific BSDF.

Recursive Application of Rule Sets

A system with multiple rule sets that are run in sequence. However, later rules may re-introduce elements that require an earlier rule set to be applied again, typically in a recursive fashion on a subtree. Giving rules a priority and always executing rules of higher priority first may be a version of this scheme.

Pre-Order Traversal

The expression tree may be traversed recursively in a depth-first and, e.g., left-to-right order. Rules may be matched against and applied on the current node. After rule application, sub-expressions may be traversed recursively. This evaluation order may be useful to establish a certain property top-down in the tree.

Post-Order Traversal

The expression tree may be traversed recursively in a depth—first and, e.g., left-to-right order. Rules may be matched against the current node only after all its sub-expression have been traversed recursively. This evaluation order may be useful to establish a certain property bottom-up in the tree.

Exhaustive Enumeration

All matching rules may be applied as different alternatives, exploring all possibilities of results that can achieved with this rule system. This exhaustive enumeration of all materials that one can derive from an input material may allow one to pick the best material according to some arbitrary optimality criterion. For typical materials the top-level of the expression tree and the number of applicable rules may be small, so this approach may be used in that case.

Partial Enumeration

Instead of exhaustive enumeration, one may steer the enumeration to a subset with strategies such as a greedy selection of the best rule or set of rules or an A*-search to prune search space.

Applying rule after rule from a rule set R to a material expression M creates a sequence of materials $M_1$ to $M_n$. For a practical system, we may want this process to terminate. Such a rule system may then reduce a material expression M to a final expression M'. For a confluent rule system, M' may be unique irrespective of the order of rule applications.

Table 11 illustrates this chain of derivation, in accordance with one embodiment. Of course, it should be noted that the chain of derivation shown in Table 11 is set forth for illustrative purposes only, and thus should not be construed as limiting in any manner.

TABLE 11

$M = M_1 \overset{\mathcal{R}}{\mapsto} M_2 \overset{\mathcal{R}}{\mapsto} \cdots \overset{\mathcal{R}}{\mapsto} M_n = M'$ We may design a rule system with the goal in mind that the resulting final expression M' fulfills a particular property or invariant. We may also design a rule system with the goal in mind that the whole sequence of material expressions $M_1$ to $M_n$, or subsequence thereof, fulfills a particular property, such that each material is a simplification of its preceding material.

Suitable rule systems may therefore be a simple and efficient means to create one level-of-detail material or a whole sequence of level-of-detail materials in one process. We may associate a cost to each rule which quantifies the approximation error and we may use exhaustive or partial enumeration to create derivation chains or final results where the aggregation of costs along the derivation chain is minimal, i.e., the simplification incurs the least possible approximation error. The costs may themselves be approximate, and they may be dependent on actual parameter values of the current expression matching the rule.

Table 12 illustrates a rule system $R_{tint}$ which may remove all tint modifiers T(c,B) from material expressions by pushing the tint color c from the BSDFs to the regular functions level, in accordance with one embodiment. For example, a tint of a diffuse BSDF may be equivalent to a diffuse BRDF with the tint color factored into its tint parameter. Of course, it should be noted that the rule system shown in Table 12 is set forth for illustrative purposes only, and thus should not be construed as limiting in any manner.

TABLE 12

$$\mathcal{R}_{tint} = \begin{cases} T(c, 0) & \mapsto 0, \\ T(c_1, D(c_2, r)) & \mapsto D(c_1 c_2, r), \\ T(c_1, S(c_2)) & \mapsto S(c_1 c_2), \\ T(c_1, G(c_2, r_u, r_v, t)) & \mapsto G(c_1 c_2, r_u, r_v, t), \\ T(c_1, T(c_2, A)) & \mapsto T(c_1 c_2, A), \\ T(c, W(w_1, A_1, \ldots)) & \mapsto W(w_1, T(c, A_1), \ldots), \\ T(c, L(w, A, B, n)) & \mapsto L(w, T(c, A), T(c, B), n), \\ T(c, F(i, w, A, B, n)) & \mapsto F(i, w, T(c, A), T(c, B), n) \end{cases}$$

This rule system may be an example of a confluent rule system. Independent of the order of rule application, all tint colors may end up multiplied to the tint parameters of elemental BSDFs. An efficient evaluation strategy may be pre-order traversal, pushing the tint modifiers from top to bottom where they disappear. Proving correctness and termination is obvious from the complete case enumeration of all BSDFs as arguments of the tint modifier, i.e., as long as a tint modifier is in the material expression, we may find a matching rule and each rule application makes progress in pushing the tint modifier to a leaf or eliminates it at a leaf.

Table 13 illustrates a systemic method for finding suitable rules, in accordance with one embodiment. Of course, it should be noted that the method shown in Table 13 is set forth for illustrative purposes only, and thus should not be construed as limiting in any manner.

TABLE 13

1. We define the terminating expressions, those that should not simplify any further.
2. For each possible node type, e.g., all BSDFs, we create matching patterns where we enumerate all possible combinations of how the terminating expressions can show in the parameters of the node type.
3. We eliminate from the patterns those that are equal to the terminating expressions from step 1.
4. For each of the remaining patterns, we choose one replacement expression from the list of terminating expressions and define the arguments of the replacement expression based on arguments of the match.

There may be many ways to find suitable rules. The method shown in Table 13 may be inductive and may be based on complete enumeration in a way that allows an efficient bottom-up post-order traversal evaluation and a simple proof of correctness.

This systematic approach may reduce the problem of finding a suitable rule set to the smaller problems of defining suitable targets and defining best replacements for the systematically defined rule set. This reduction to a single rule where the pattern is rather specific may allow a simpler and more focused reasoning of what a good target expression is and what best arguments would be. The examples below make use of this approach.

Variants and Extensions

One idea described herein is the framework of representing a material as a semantically specified expression and applying a term-rewriting system to create a final expression, or a sequence of expressions on the way to the final expression. The following describe variants and extensions to this principle.

Acyclic Graphs

The expression trees used to define a material may be extended to an acyclic graph representation by allowing a way to give sub-expression a name and use those names instead of expressions in other places. Cycles may be prevented in this representation and can, for example, be ruled out with a definition-before-use restriction on those names without losing generality.

Material Classes

Material expressions may be fully defined with values for each parameter. However, material definitions in MDL (a.k.a material class) may allow a user to program materials with additional parameters that are left unspecified, until a user of this material provides values for those parameters later, creating a material instance from the material class. Rule systems may be easily applied to material expressions that include placeholders for yet unspecified parameters. They might not be as effective, for example, if a parameter variable is a distribution function. An effective solution may restrict material classes to have only variables for nodes that are not distribution function.

Evaluating Generic Functions

When working with material instances, we may evaluate the arguments in the expression tree and use that information in rules. For example, a rule could remove a BSDF in a mixer or layerer, if its weight is below a certain threshold. We may evaluate uniform arguments fully before rendering starts. For varying arguments, such as expressions with procedural or bitmap textures, we may sample the domain to obtain a representative value or use interval arithmetic to obtain bounds on a possible value range and use those for decision making. See, for example, "Automatic bounding of programmable shaders for efficient global illumination" (Velazquez-Armendariz et al.), which is hereby incorporated by reference in its entirety.

User Annotations

The system may be extended to incorporate annotations that MDL material authors or users can leave in the material and that the rules can use in the match. Such annotations may give, for example, a hint which BSDF is more important than another BSDF. A specific annotation may just add a floating point value as an importance weight on each BSDF. A rule can see that weight as an additional argument in each BSDF and use it to decide which BSDF to keep and which one to throw away.

In one embodiment, the system may be extended to incorporate metadata associated with a material that material authors or users can define for the material and that the rules can use in the match. Such metadata may be included in a material in the form of annotations.

Rules on Generic Functions

Similar replacement rules may be defined and applied on generic functions if those functions have specified semantics. Candidates could be standard libraries, for example, for texture lookups and transformations, where a rule system could be devised to transform complex texture networks into a more efficient canonical texture processing pipeline.

Unification

The pattern matching part of the rule system may be extended to match multiple patterns at the same time and then use the unification algorithm known from Prolog to bind variables.

Besides these variants and extensions to the basic framework, it is worth mentioning that other existing ideas around material simplification may be integrated into this framework, for example, leading to rules with high approximation qualities. Some examples are shown below.

Approximating Bump Maps by Roughness Maps

A rule may replace the bump map n of a material by a suitable roughness map of the respective material BSDF, such as a glossy BSDF Approximating Car-Paint Flakes by Glossy Far-Field Look A car-paint with flakes may be approximated by a glossy BSDF that matches a far field look of the flakes.

Procedural Multi-Scale Materials

A procedural shading model may be used for real-time LOD evaluation. See, for example, "Real-time rendering of procedural multiscale materials" (Zirr et al.), which is hereby incorporated by reference in its entirety. Ideas from that model may be used to statically replace a complex high-detail material with a simpler low-detail far field material.

Texture Baking

The above framework may suggest that the complexity in the declarative part of the material expression, the distribution functions, is simplified with rules, and possibly at the cost of adding complexity to the regular functions part of the material expression. Depending on the target and the specific rule system, this may be sufficient, e.g., if the target execution context allows for programmable functions.

However, in other contexts, this may not be sufficient. We discuss in this section briefly the option to use texture baking as complementary technique to augment our framework. Note also that the use of texture baking is orthogonal to this framework, which may be used with or without baking without change.

If we remove the declarative part of the material expression, we are left with a forest, a set of trees, each tree providing a value for a parameter of the declarative part. Each tree may now be baked into its own texture. Baking may evaluate the sub-expression at suitable settings of the render state, such as uv-coordinates or object space coordinates if projectors play a role, and store the result in a texture. A baking solution may depend on the complexity and smartness of heuristics deployed and possibly augmented with user control to select size and resolutions of textures.

System Integrations

Figure 2:
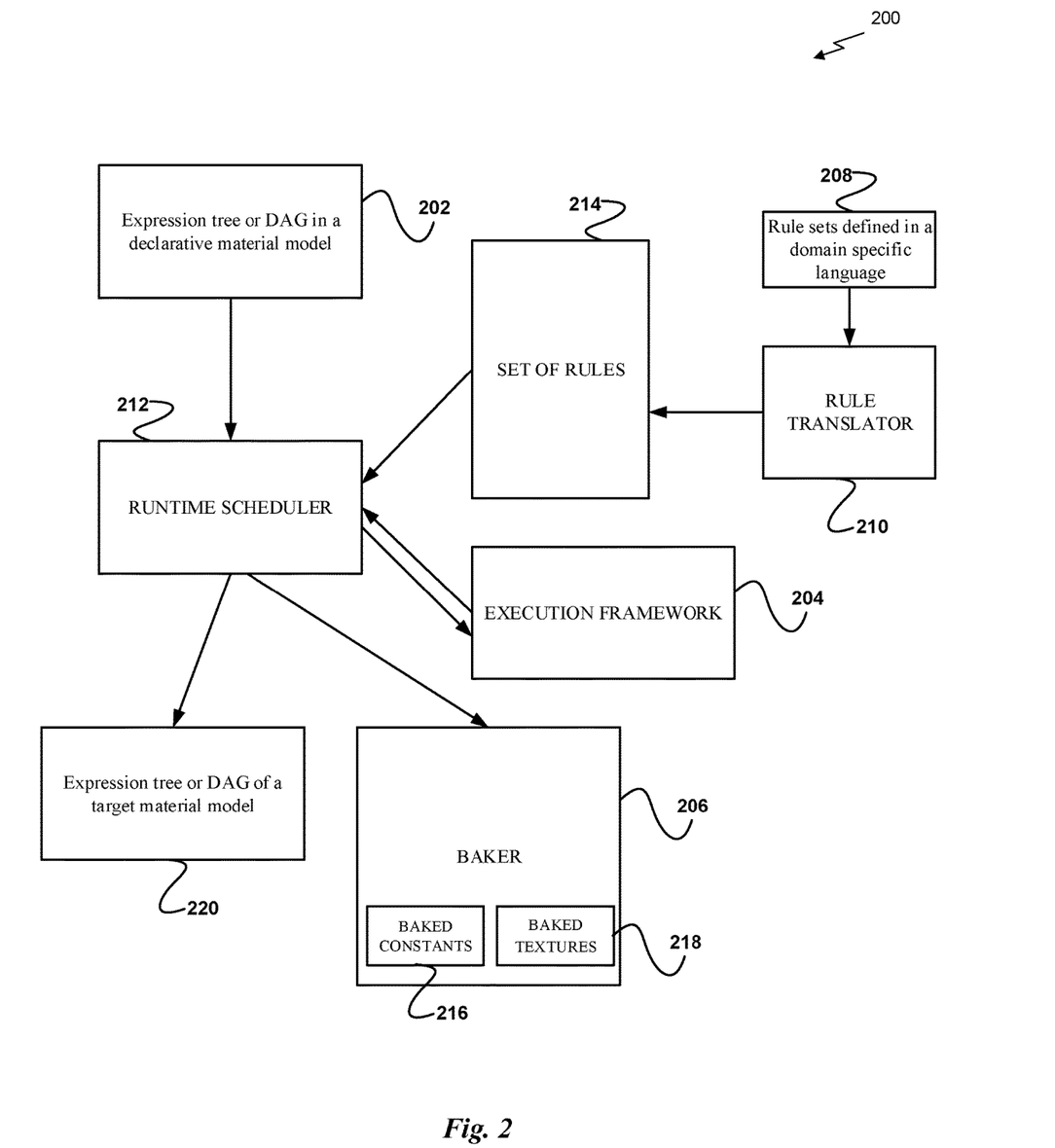
FIG. 2 illustrates an exemplary environment for implementing a level-of-detail framework, in accordance with one embodiment.

An integration of this framework may include several parts. Some parts have a variety of choices how they are realized in a particular system. FIG. 2 shows an exemplary environment 200 for implementing a level-of-detail framework, according to one embodiment.

As shown, the environment 200 includes an expression tree or DAG in a declarative material model 202 that is input to a runtime scheduler 212. In one embodiment, the material model 202 may include a sufficiently formal defined declarative representation that can be expressed as a tree or DAG. In another embodiment, the runtime scheduler 212 may apply rule sets 214 to the declarative material model 202 in an execution framework 204. The runtime scheduler 212 may manage the high-level execution strategy, in which order rule sets and individual rules are tested for a match and executed.

Additionally, the execution framework 204 may be used to apply rules 214 to material expressions 202. This may be a custom solution for a specific set of rules, or a generic framework, which would allow different rule sets. As shown, the rule sets may be flexibly changed, up to late customization in applications and as end-user accessible feature.

Further, the rule sets 214 may include a set of rules accomplishing a desired effect. In one embodiment, the rule sets 214 may accomplish reductions to fixed material models. The rules within the rule sets 214 may imply an approximation of the material, which may include a judgment of what to optimize for. Those judgments may be delayed by making them parameters of the rules and giving the users of the rule set the choice to set those parameters.

Further still, rule sets defined in a domain specific language 208 are translated utilizing using a rule translator 210 and saved within the set of rules 214. In one embodiment, the rule sets defined in the domain specific language 208 may be created utilizing a notation to define rules and their effect. This may range from an implementation of the rules in the execution framework itself, and it may include an exposed application program interface (API) to allow developers to implement rules independent of the execution framework, and it may even be a domain specific language (DSL) to allow users to develop their own rules, or to manage existing rule sets.

Also, the rule translator 210 makes rules executable with the execution framework. This may include the native application's compiler for an API approach, or a custom compiler for a DSL approach.

Additionally, the environment 200 includes a texture baker 206 that includes baked constants 216 and baked textures 218. In one embodiment, texture baking or runtime execution may be used to handle generic function expressions. Their implementation and quality may be orthogonal to the framework of the environment 200.

Further, after applying the rule sets 214 to the material expressions 202, the runtime scheduler 212 outputs an expression tree or DAG of a target material model 220.

Figure 3:
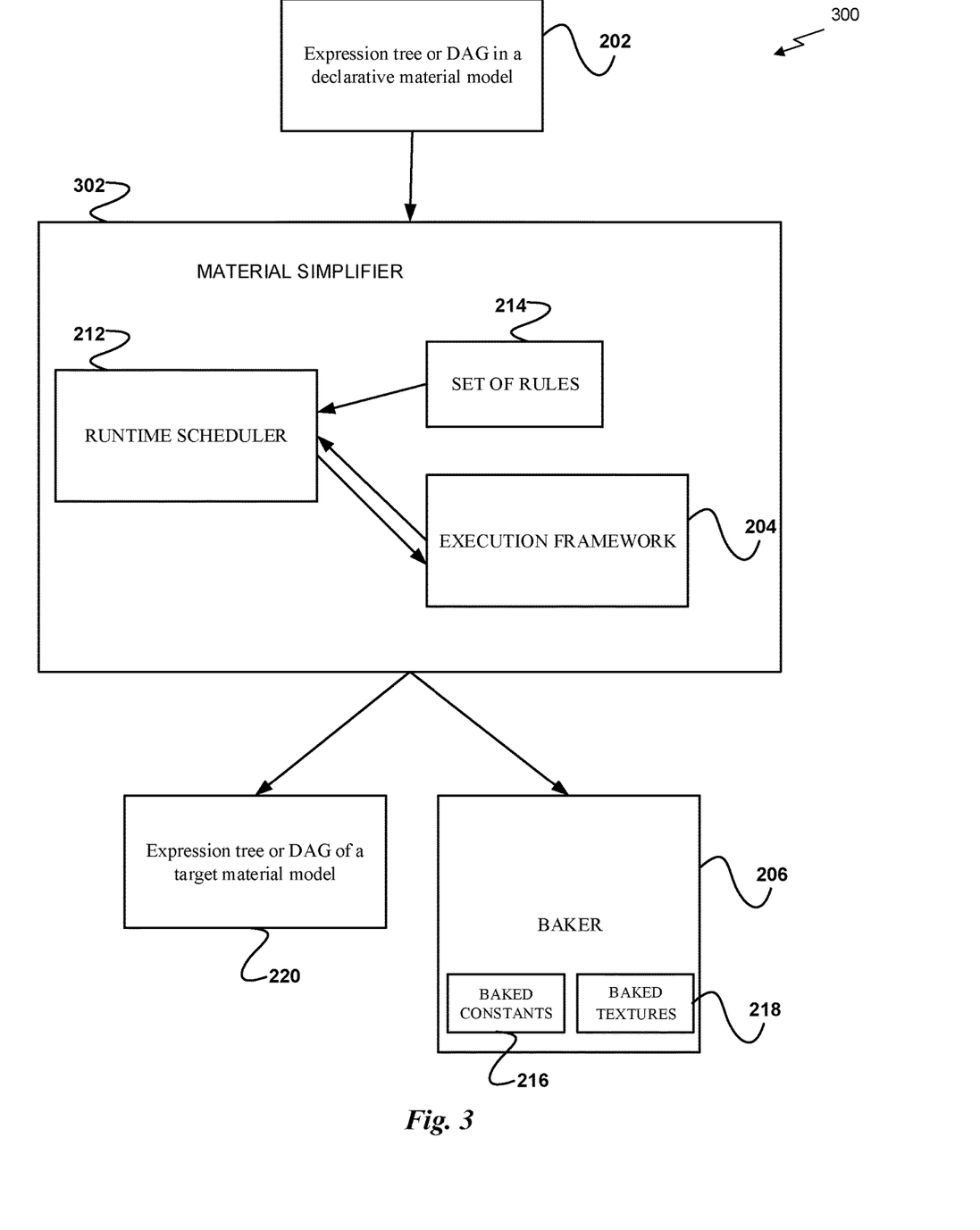
FIG. 3 illustrates another exemplary environment for implementing a level-of-detail framework with built-in rules, in accordance with one embodiment.

FIG. 3 illustrates another exemplary environment 300 for implementing a level-of-detail framework with built-in rules, according to one embodiment. As shown, the environment 300 includes an expression tree or DAG in a declarative material model 202 that is input to a material simplifier 302. The material simplifier 302 includes the runtime scheduler 212 as well as the rule sets 214 and the execution framework 204.

After applying the rule sets 214 to the material expressions 202 in the execution framework 204, the runtime scheduler 212 outputs an expression tree or DAG of a target material model 220. The environment 300 also includes the texture baker 206 that includes baked constants 216 and baked textures 218.

In this way, the runtime scheduler 212, rule sets 214, and the execution framework 204 may all be included within the material simplifier 302, which may form a monolithic system.

Results for Example Rule Systems

In one embodiment, we may define example rule sets, discuss their properties, and determine how they perform on a larger set of material definitions.

One rule system may reduce each material to a single diffuse BRDF with one texture for its tint color. This may be a useful target for a material level-of-detail, and it may be used as a first approximation in editing viewports where applications might not have a lot of flexibility in showing materials.

Local normal maps may play a role for the look of various materials. We may develop a rule system to aggregate local normal maps to one approximated global normal map.

Another rule system may reduce each material to a kind of dielectric material, a Fresnel-layered glossy BRDF over a diffuse BRDF. This may be an intermediate step in a level-of-detail representation. Additionally, this framework may target such a material, for example, in a game engine or other applications favoring a fixed material model over a programmable one.

Reduction to a Single Diffuse BRDF

In one embodiment, we may simplify a material to a single diffuse BSDF with the following rule set in a post-order traversal. As a prerequisite, we may run the rule system $R_{tint}$ first to eliminate all tint modifiers.

Table 14 illustrates a rule set for reduction to a single diffuse BRDF, in accordance with one embodiment. Of course, it should be noted that the rule set shown in Table 14 is set forth for illustrative purposes only, and thus should not be construed as limiting in any manner.

TABLE 14

$$\mathcal{R}_{\mathit{diff}} = \begin{cases} 0 & \mapsto D(0.0, 0.0) \\ S(c) & \mapsto D(c, 0.0) \\ G(c, r_u, r_v, t) & \mapsto D(c, 0.0) \\ W(w, D(c, r)) & \mapsto D(wc, r) \\ W(w_1, D(c_1, r_1), \ldots) & \mapsto D(w_1 c_1 + \ldots, f_{dr}(w_1, r_1, \ldots)) \\ L(w, D(c_1, r_1), D(c_2, r_2), n) & \mapsto W(w, D(c_1, r_1), 1 - w, D(c_2, r_2)) \\ & \mapsto D(wc_1 + (1-w)c_2, f_{dr}(r_1, r_2)) \\ F(i, w, D(c_1, r_1), D(c_2, r_2), n) & \mapsto L(f_F(i)w, D(c_1, r_1), D(c_2, r_2), n) \\ & \mapsto D(f_F(i)wc_1 + (1 - f_F(i)w)c_2, f_{dr}(r_1, r_2)) \end{cases}$$

In one embodiment, $f_{dr}$ may include a suitable function to blend the diffuse roughness values, and $f_F$ may include a suitable function of how much of the Fresnel-layered top BSDF we want to blend into the base layer, which may depend on the IOR value i of the layering.

The function $f_{dr}$ may be, for example, the maximum roughness value or an affine weighted sum like for the color values.

The function $f_F$ may be the reflectivity of the Fresnel term at normal direction, e.g., 0.04 for a typical IOR of 1.5. This may be a suitable value arguing that typically large parts of an object face us and only a small fraction is viewed at grazing angles. However, if the goal would not be a best look approximation but whether all features are visible, we may want to make this value larger so that possible texturing effects in the top layer remain recognizable. A default in experiments below may include a constant value of 0.1.

Correctness: Unless the expression consists of a single diffuse BRDF, there is always a rule that is matching. This is based on the complete enumeration of all cases of BSDFs excluding the terminating expression (the diffuse BSDF). By bottom-up induction it further suffices for a BSDF with other BSDFs as arguments if the matching pattern just matches the terminating diffuse BSDF for those arguments.

The rule system terminates with a finite number of steps (and results in the single diffuse BRDF then). We argue with an integer cost function, which is the sum of all cost values that we associate with each BSDF node: 0, S, and G nodes cost two, and D, W, L, and F nodes cost one. A material expression has thus an integral cost, which is linear in the number of nodes. The cost is greater or equal to one, and only one if it is a single diffuse BRDF. Each rule application reduces the cost by at least one. After a linear number of rule applications, we reach the terminating case.

The post-order traversal may result in an efficient evaluation of this rule system with its bottom-up application of rules.

Handling of a Local Normal Map

The rule set $R_{\mathit{diff}}$ in the previous section may ignore the local normal maps n of the respective rules that match weighted layering (L( . . . )) and Fresnel layering (F( . . . )). Instead, we may transfer the local normal map to the global normal map, respecting the weights that influence the layer with the local normal map.

We may accomplish this by introducing a new distribution function N, a kind of place-holder that only represents the current local normal map n: N(n).

We may then use a similar rule system as for the diffuse target material that aggregates the local normal maps to a single one, best bottom-up in a postorder traversal. Note that $n_s$ may be the default shading normal in the render state, and $f_n$ ($w_1$, $n_1$, . . . ) may include a function that scales normal maps according to weights and blends them together.

Table 15 illustrates a rule set for handing a local normal map, in accordance with one embodiment. Of course, it should be noted that the rule set shown in Table 15 is set forth for illustrative purposes only, and thus should not be construed as limiting in any manner.

TABLE 15

$$\mathcal{R}_{\mathit{norm}} = \begin{cases} 0 & \mapsto N(n_s), \\ D(c, r) & \mapsto N(n_s), \\ S(c) & \mapsto N(n_s), \\ G(c, r_u, r_v, t) & \mapsto N(n_s), \\ W(w_1, N(n_1), \ldots) & \mapsto N(f_n(w_1, n_1, \ldots)), \\ L(w, N(n_1), N(n_2), n) & \mapsto N(f_n(w, n, 1-w, n_2)), \\ F(i, w, N(n_1), N(n_2), n) & \mapsto N(f_n(f_F(i)w, n, 1 - f_F(i)w, n_2)) \end{cases}$$

The result of applying the rules in FIG. 15 may include a single local normal map that may be combined with the global normal map of the material model. Note that the behavior of the layering BSDFs in MDL may be different than what is encoded in $R_{\mathit{norm}}$ if multiple layerers are nested.

The system is fast for practical material complexities and may be deployed in real-time editing contexts working on material instances. It may bridge the gap between a rich material model and the fixed material models common in game engines and editing viewports.

Term Rewriting for Materials—Algebraic Explanation

The declarative definition of the distribution function part of a physical-based material model may be represented as an expression tree in an algebra that consists of all distribution functions specified in the language and the operations to combine them. Argument values for the distribution function parameters may be determined by literal values and function call graphs. Directed acyclic call graphs may be handled by unrolling them to a tree.

A rule for a term rewriting system may consist of a pattern that can match a sub-expression in the declarative part of the expression tree, and a replacement expression. Table 16 illustrates an exemplary rule, in accordance with one embodiment. Of course, it should be noted that the rule set shown in Table 16 is set forth for illustrative purposes only, and thus should not be construed as limiting in any manner.

TABLE 16 mix($w_1$, diff($c_1$), $w_2$, diff($c_2$)) → diff($w_1 c_1 + w_2 c_2$)

The rule in Table 16 may include a simple example for a pattern that may match a weighted mix of two colored diffuse distribution functions and replace it with a single diffuse distribution function with weighted color arguments.

Table 17 illustrates an exemplary application of rules to material expressions, in accordance with one embodiment. Of course, it should be noted that the application shown in Table 17 is set forth for illustrative purposes only, and thus should not be construed as limiting in any manner.

TABLE 17

$$M_1 \overset{\mathcal{R}}{\Longrightarrow} M_2 \overset{\mathcal{R}}{\Longrightarrow} \cdots \overset{\mathcal{R}}{\Longrightarrow} M_n$$

As shown in Table 17, given a suitable set $\mathcal{R}$ of rules and applying rule after rule to an initial material expression $M_1$ creates a sequence of materials, where assuming termination, $\mathcal{R}$ reduces $M_1$ to a final expression $M_n$. Term rewriting may be a simple and efficient means to create one simplified material $M_n$ or a whole sequence $<M_1>$ for a level-of-detail representation created in one process.

Creating Suitable Sets of Rewriting Rules—Algebraic Explanation

Important questions for a term rewriting system and its set of rules may include termination, confluence (e.g., does there exist a unique normal form where no rule applies anymore), and runtime efficiency. Evaluation strategies for efficient systems may be top-down or bottom-up.

In particular, a bottom-up evaluation strategy may lead to a systematic process of deriving a rule set whose correctness follows easily by induction. We start by defining the normal forms that are terminal states in the derivation chain, such as a single diffuse material, or a material model used.

Table 18 illustrates an exemplary process to derive a rule system, in accordance with one embodiment. Of course, it should be noted that the process shown in Table 18 is set forth for illustrative purposes only, and thus should not be construed as limiting in any manner.

TABLE 18

(1) Define the set of normal form expressions $\mathcal{N}$.
(2) For all distribution functions D of the language and combinations of how normal forms in $\mathcal{N}$ can be used as arguments for the parameters of D, create a matching pattern.
(3) Eliminate patterns that are equal to a normal form in $\mathcal{N}$.
(4) For each of the remaining patterns, choose a normal form from $\mathcal{N}$ that is a good replacement expression and define its arguments based on arguments of the match. The choice of the normal form and its arguments can introduce approximations and give room for optimizations.

Rules, like the example above in Table 18, may transfer complexity from the declarative expression to the regular function call graph. Other rules might lower total complexity by just picking parts with the highest weight. Function call graph complexity may be further reduced with the complementary and orthogonal technique of texture baking, i.e., evaluating function subgraphs over a suitable domain and replacing the subgraph with a simple bitmap texture lookup. Rules can be complemented with partial evaluation, where functions are evaluated or sampled at simplification time.

The resulting value may control rule behavior or be baked for use at render time. The ideas presented here apply analogously to all kinds of distribution functions, such as for transmission, emission, volume effects, as well as other parts of a material, such as normal maps, and general function call graphs, assuming their components are specified as algebra.

Figure 4:
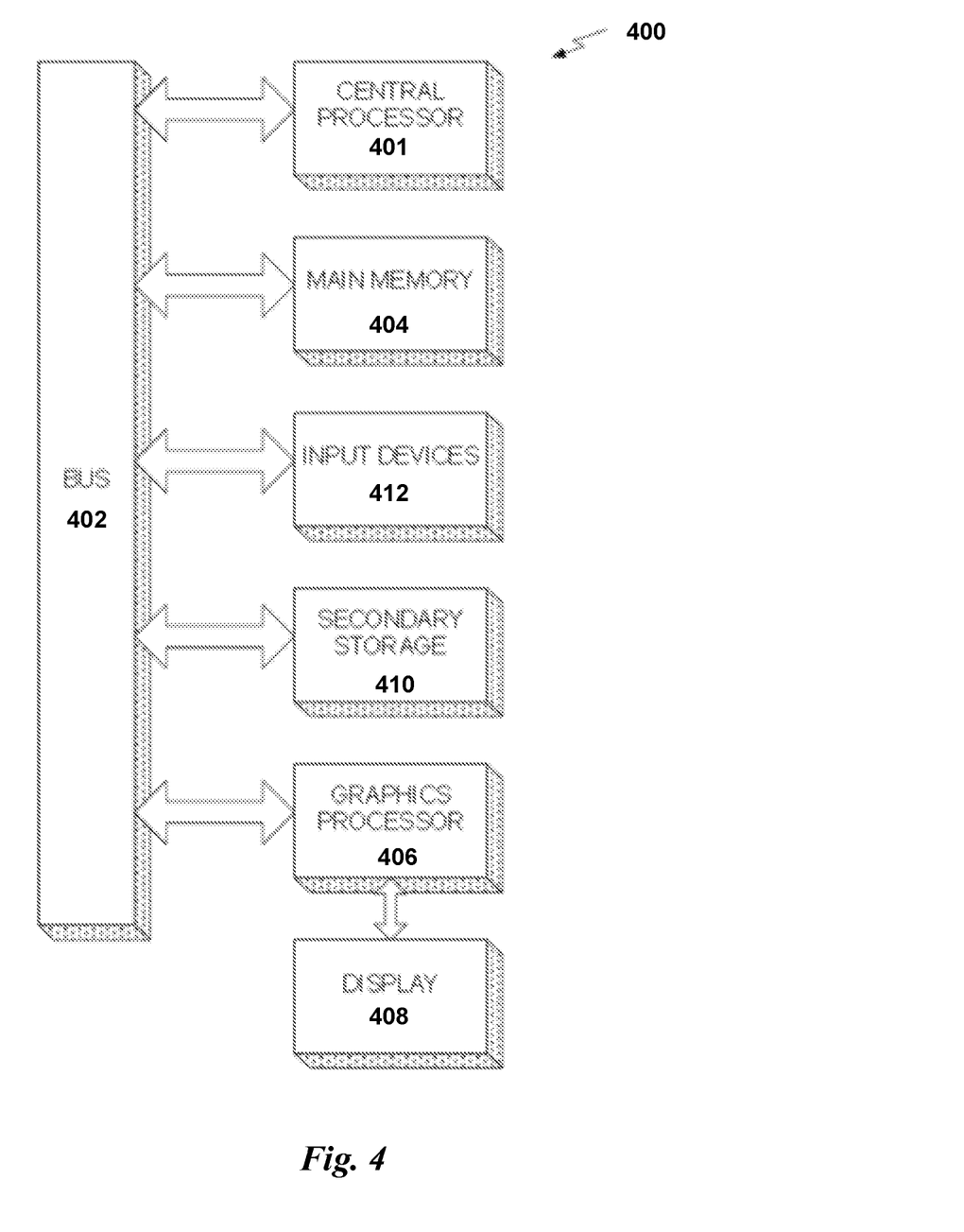
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one central processor 401 that is connected to a communication bus 402. The communication bus 402 may be implemented using any suitable protocol, such as PCI (Peripheral Component Interconnect), PCI-Express, AGP (Accelerated Graphics Port), HyperTransport, or any other bus or point-to-point communication protocol(s). The system 400 also includes a main memory 404. Control logic (software) and data are stored in the main memory 404 which may take the form of random access memory (RAM).

The system 400 also includes input devices 412, a graphics processor 406, and a display 408, i.e. a conventional CRT (cathode ray tube), LCD (liquid crystal display), LED (light emitting diode), plasma display or the like. User input may be received from the input devices 412, e.g., keyboard, mouse, touchpad, microphone, and the like. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 400 may also include a secondary storage 410. The secondary storage 410 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 404 and/or the secondary storage 410. Such computer programs, when executed, enable the system 400 to perform various functions. The memory 404, the storage 410, and/or any other storage are possible examples of computer-readable media.

In one embodiment, the architecture and/or functionality of the various previous figures may be implemented in the context of the central processor 401, the graphics processor 406, an integrated circuit (not shown) that is capable of at least a portion of the capabilities of both the central processor 401 and the graphics processor 406, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, laptop computer, server, workstation, game consoles, embedded system, and/or any other type of logic. Still yet, the system 400 may take the form of various other devices including, but not limited to a personal digital assistant (PDA) device, a mobile phone device, a television, etc.

Further, while not shown, the system 400 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
   identifying a declarative representation of a material to be rendered, the declarative representation including expressions representing a structural part in the material as one or more functions defining a distribution of light as it interacts with the material;
   creating a reduced complexity declarative representation of the material by applying one or more term rewriting rules to the expressions, wherein the one or more term rewriting rules map the material to another material by pattern matching one or more of the expressions with one or more other expressions; and
   returning the reduced complexity declarative representation of the material.

2. The method of claim 1, wherein the declarative representation includes an expression tree or a directed acyclic graph (DAG).

3. The method of claim 1, wherein the declarative representation includes an expression tree, where one or more nodes of the expression tree each represent each represent the one or more functions defining the distribution of light as it interacts with the material.

4. The method of claim 1, wherein the material is rendered utilizing a physical based rendering (PBR) model.

5. The method of claim 1, further comprising determining an order in which the one or more term rewriting rules are applied to the expressions.

6. The method of claim 1, wherein the one or more term rewriting rules are applied to the expressions to create a sequence of declarative representations of the material that terminate with the reduced complexity declarative representation of the material.

7. The method of claim 1, wherein a parameter value of each of the expressions conditionally prevents a matching of each of the term rewriting rules.

8. The method of claim 1, further comprising including annotations or other metadata associated with the declarative representation, where the annotations or other metadata are used to select the one or more term rewriting rules or are used as additional parameters during the applying of the one or more term rewriting rules to the expressions.

9. The method of claim 1, wherein a plurality of the term rewriting rules are applied to the expressions in all possible orders to create a plurality of reduced complexity declarative representations of the material, and one of the plurality of reduced complexity declarative representations of the material is selected according to one or more predetermined criteria.

10. The method of claim 1, wherein a plurality of term rewriting rules are applied in a subset of all possible orders, using a predetermined selection strategy, to create a plurality of reduced complexity declarative representations of the material, and one of the plurality of reduced complexity declarative representations of the material is selected according to one or more predetermined criteria, where the predetermined selection strategy is based on greedy selection, an arbitrary cost function, or selection criteria on which rules to apply and which ones to not apply.

11. The method of claim 1, wherein the expressions are traversed recursively in a depth first, left to right order, and the one or more term rewriting rules are matched against and applied on a current expression of the declarative representation during traversal, where sub-expressions of the declarative representation are traversed recursively after applying the one or more term rewriting rules.

12. The method of claim 1, wherein the expressions are traversed recursively in a depth first, left to right order, and the one or more term rewriting rules are matched against and applied on a current expression of the declarative representation only after all sub-expressions of the current expression have been traversed recursively.

13. The method of claim 1, further comprising determining the one or more term rewriting rules by:
   defining a plurality of terminating expressions;
   creating a plurality of matching patterns for all BSDFs within the declarative representation, where the plurality of matching patterns enumerate all possible combinations of how the plurality of terminating expressions can show in parameters of the BSDFs;
   eliminating from the plurality of matching patterns those that are equal to the plurality of terminating expressions to create a plurality of remaining patterns; and
   for each of the plurality of remaining patterns, choosing a replacement expression from the plurality of terminating expressions and defining arguments of the replacement expression based on arguments of a match within the remaining pattern.

14. A system comprising:
   a processor that is configured to:
      identify a declarative representation of a material to be rendered, the declarative representation including expressions representing a structural part in the material as one or more functions defining a distribution of light as it interacts with the material;
      create a reduced complexity declarative representation of the material by applying one or more term rewriting rules to the declarative representation of the material, wherein the one or more term rewriting rules map the material to another material by pattern matching one or more of the expressions with one or more other expressions; and
      return the reduced complexity declarative representation of the material.

15. The system of claim 14, wherein the declarative representation includes an expression tree or a directed acyclic graph (DAG).

16. The system of claim 14, wherein the declarative representation includes an expression tree, where one or more nodes of the expression tree each represent the one or more functions defining the distribution of light as it interacts with the material.

17. The system of claim 14, wherein the material is rendered utilizing a physical based rendering (PBR) model.

18. The system of claim 14, wherein the processor is further configured to determine an order in which the one or more term rewriting rules are applied to the expressions.

19. The system of claim 14, wherein the one or more term rewriting rules are applied to the expressions to create a sequence of declarative representations of the material that terminate with the reduced complexity declarative representation of the material.

20. A non-transitory computer-readable storage medium storing instructions that, when executed by a processor, causes the processor to perform steps comprising:
- identifying a declarative representation of a material to be rendered, the declarative representation including expressions representing a structural part in the material as one or more functions defining a distribution of light as it interacts with the material;
- creating a reduced complexity declarative representation of the material by applying one or more term rewriting rules to the declarative representation of the material, wherein the one or more term rewriting rules map the material to another material by pattern matching one or more of the expressions with one or more other expressions; and
- returning the reduced complexity declarative representation of the material.

* * * * *